(12) United States Patent
Wallace et al.

(10) Patent No.: US 6,709,291 B1
(45) Date of Patent: Mar. 23, 2004

(54) APPARATUS AND METHOD FOR SHIELDING A CIRCUIT FROM ELECTROMAGNETIC INTERFERENCE

(75) Inventors: David Lee Wallace, Wixom, MI (US); John Frederick Richards, Brighton, MI (US)

(73) Assignee: TRW Inc., Lyndhurst, OH (US)

( * ) Notice: Subject to any disclaimer, the term of this patent is extended or adjusted under 35 U.S.C. 154(b) by 97 days.

(21) Appl. No.: 09/599,320

(22) Filed: Jun. 22, 2000

(51) Int. Cl.[7] .............................................. H01R 13/648
(52) U.S. Cl. ........................................................ 439/607
(58) Field of Search ............................ 439/607, 95, 96, 439/76.1, 79, 609; 479/722; 264/272.11, 272.15, 272.19, 273, 274

(56) References Cited

U.S. PATENT DOCUMENTS

| 4,012,672 | A | * | 3/1977 | Douglass et al. .............. 439/95 |
| 5,130,896 | A | * | 7/1992 | Babb et al. ............ 174/35 GC |
| 5,600,092 | A | | 2/1997 | Patscheck et al. |
| 5,652,410 | A | | 7/1997 | Hobbs et al. |
| 5,703,754 | A | * | 12/1997 | Hinze ........................... 439/95 |
| 5,743,751 | A | * | 4/1998 | Davis et al. ................... 439/79 |
| 5,863,222 | A | * | 1/1999 | Kinsey et al. .............. 439/607 |
| 5,872,332 | A | | 2/1999 | Verma |
| 6,005,186 | A | | 12/1999 | Bachman |
| 6,068,130 | A | | 5/2000 | Fratti |
| 6,155,876 | A | * | 12/2000 | Ho et al. ..................... 439/607 |
| 6,431,884 | B1 | * | 8/2002 | Wallace et al. ............. 439/606 |

* cited by examiner

*Primary Examiner*—Renee Luebke
*Assistant Examiner*—Felix O. Figueroa
(74) *Attorney, Agent, or Firm*—Tarolli, Sundheim, Covell & Tummino L.L.P.

(57) ABSTRACT

A housing (10) for shielding a circuit (12) from electromagnetic interference comprises a shielding component (20) having at least one aperture (40). A plastic material (50) is molded over the shielding component (20). A portion (54) of the plastic material (50) is received within the aperture (40) for securing the plastic material to the shielding component (20). A method of making a housing (10) for shielding a circuit (12) from electromagnetic interference includes the steps of providing a shielding component (20) having an aperture (40); molding a plastic material (50) over the shielding component; and securing the plastic material to the shielding component by receiving a first portion (54) of the plastic material into the aperture in the shielding component.

13 Claims, 3 Drawing Sheets

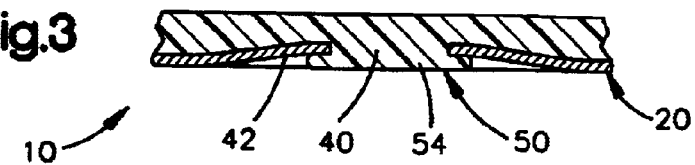

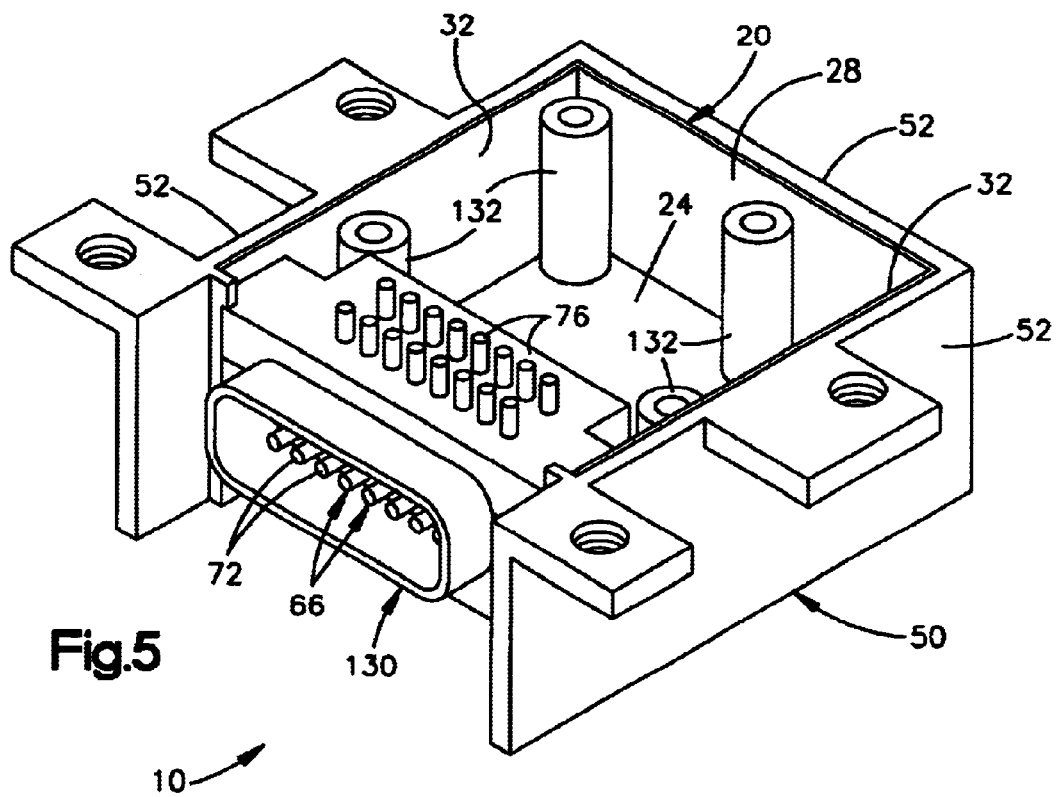
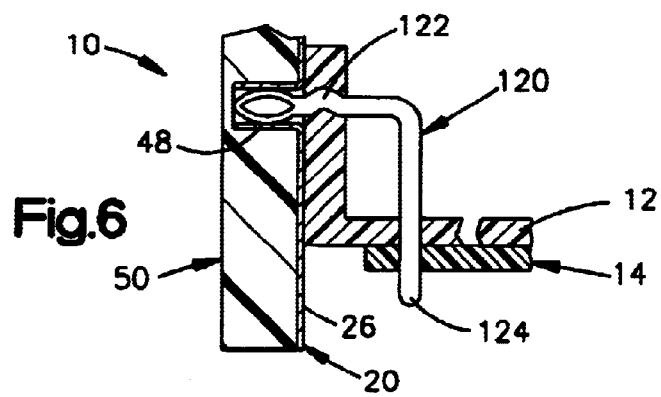
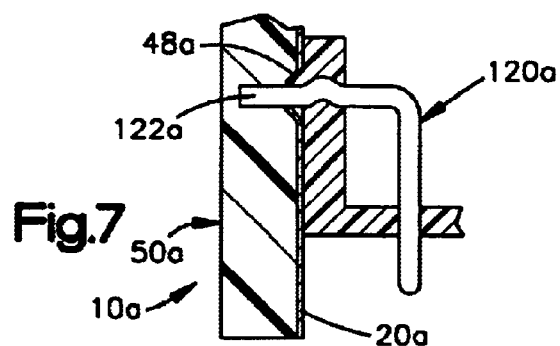

APPARATUS AND METHOD FOR SHIELDING A CIRCUIT FROM ELECTROMAGNETIC INTERFERENCE

TECHNICAL FIELD

The present invention relates to an apparatus and associated method for housing a circuit and, more particularly, to an apparatus and associated method for shielding a circuit from electromagnetic interference.

BACKGROUND OF THE INVENTION

Electronic circuitry is used in a wide variety of applications, such as controlling the deployment of air bags in a occupant protection system. An electronic circuit is often formed or mounted upon a circuit board. The operation of electronic circuitry can be adversely affected by electromagnetic interference. Shielding electronic circuitry from electromagnetic interference can, therefore, improve the operation of the circuit.

The amount of electromagnetic interference to which electronic components are exposed can be limited by locating the components in a protective housing which shields the components from the interference. U.S. Pat. No. 5,872,332 discloses a molded housing with EMI shield. A metal shield is stamped from sheet metal into a box shape. The stamped metal box shields the circuit from electromagnetic interference. The metal box is then insert molded into a plastic housing. The plastic housing is a polymer material, such as polyethylene terephthalate. A circuit board containing necessary components is then placed within and secured to the housing.

SUMMARY OF THE INVENTION

The present invention is directed to a housing and associated method for shielding a circuit from electromagnetic interference, in which a molded portion of the housing is received within an aperture for securing parts of the housing together.

In accordance with one exemplary embodiment of the invention, a housing for shielding a circuit from electromagnetic interference comprises a shielding component having at least one aperture. A plastic material is molded over the shielding component. A portion of the plastic material is received within the at least one aperture for securing the plastic material to the shielding component.

In accordance with another exemplary embodiment of the invention, a method of making a housing for shielding a circuit from electromagnetic interference includes the steps of providing a shielding component having an aperture; molding a plastic material over the shielding component; and, securing the plastic material to the shielding component by receiving a first portion of the plastic material into the aperture in the shielding component.

BRIEF DESCRIPTION OF THE DRAWINGS

The foregoing and other features and advantages of the present invention will become more apparent to one skilled in the art upon consideration of the following description of the invention and the accompanying drawings, wherein:

FIG. 3 is a sectional view of a portion of the housing of FIG. 1, showing a mechanical interconnection between the shielding component and a plastic material;

FIG. 4 is a partial sectional view of the housing of FIG. 1, showing an insulator and connector pins that form part of the housing of FIG. 1;

FIG. 5 is a bottom perspective view of the housing of FIG. 1;

FIG. 6 is a partial sectional view of the housing of FIG. 1, showing a grounding pin that forms part of the housing of FIG. 1; and FIG. 7 is a partial view similar to FIG. 6, showing an alternative grounding pin.

DESCRIPTION OF AN EXEMPLARY EMBODIMENT

Figure 1:
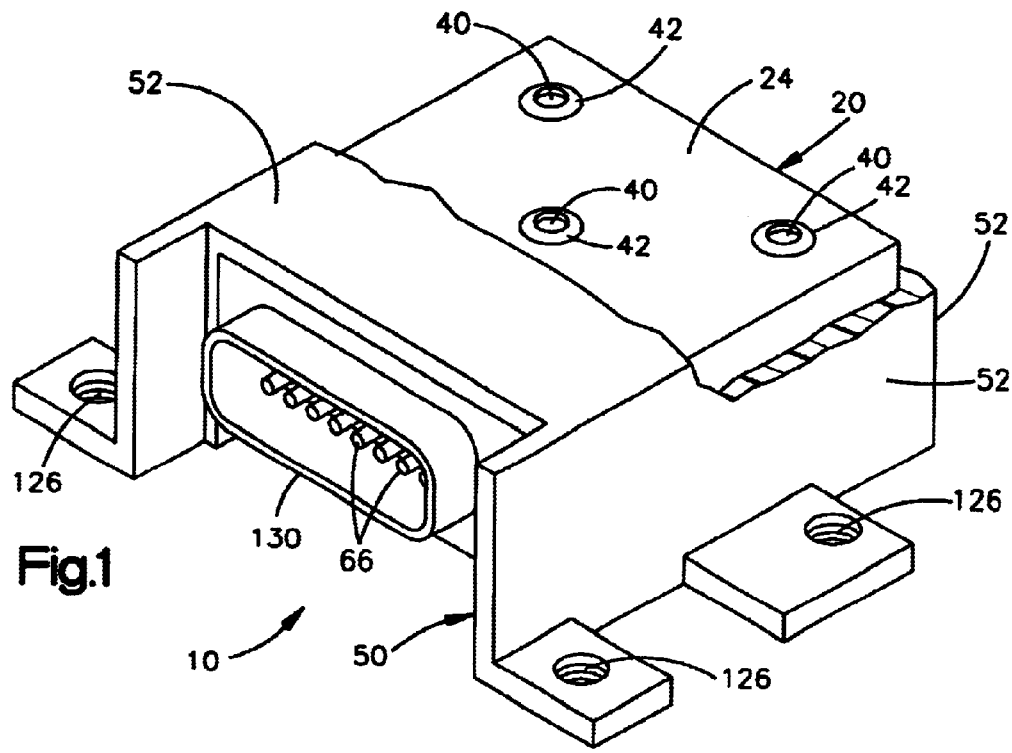
FIG. 1 is a top perspective view, partially cut away, of a housing in accordance with the present invention.
Figure 2:
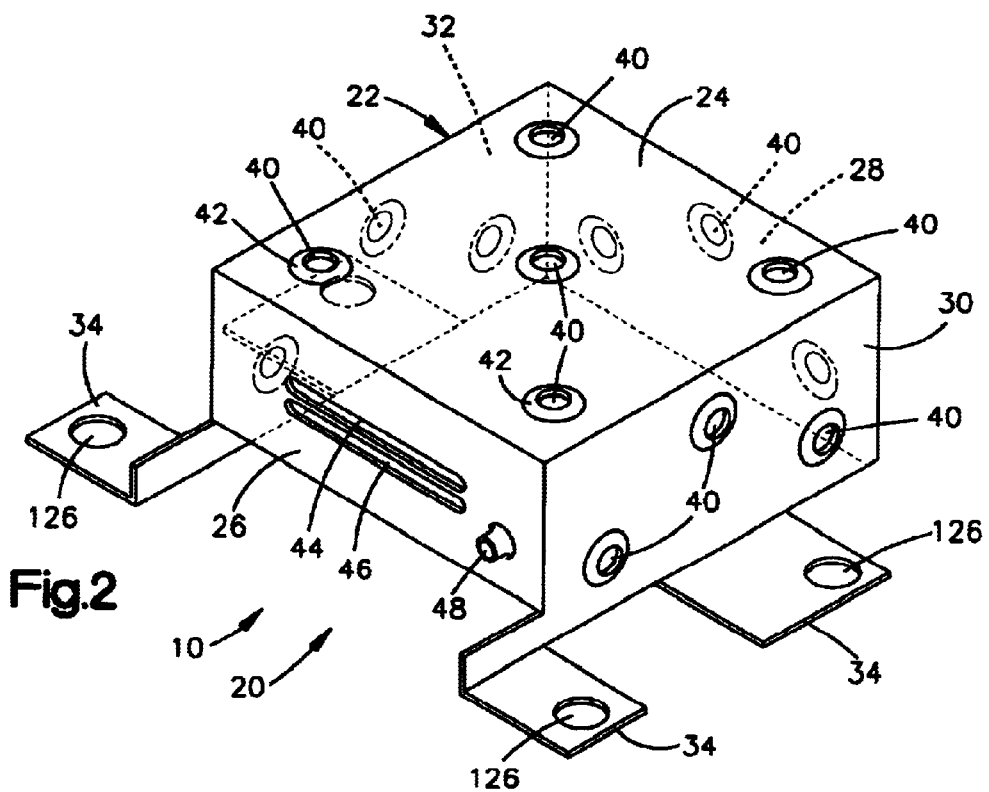
FIG. 2 is a perspective view of a shielding component that forms part of the housing of FIG. 1.

The present invention relates to an apparatus and method for housing a circuit. The present invention is applicable to various housing constructions. As representative of the present invention, FIG. 1 illustrates a housing 10 for shielding a circuit 12. The housing 10 includes a shielding component 20 (FIG. 2), and a body of non-conducting plastic material 50 (FIG. 1).

The shielding component 20 (FIG. 2) is formed from a single piece of thin sheet metal 22 stamped and formed into the illustrated configuration. The thickness of the sheet metal 22 is selected so that the sheet metal can adequately shield, from electromagnetic interference, a circuit such as a circuit used to control the deployment of air bags in a vehicle. The sheet metal 22 may have a thickness, for example, of approximately 0.3 millimeters.

In the illustrated embodiment, the shielding component 20 has a box-shaped configuration having a plurality of walls. The plurality of walls includes a top wall 24, a front wall 26 and an opposite back wall 28, and two opposite side walls 30 and 32. The shielding component 20 does not have a bottom wall. The shielding component 20 also includes a plurality of mounting flanges, or ears, 34 which project from the side walls 30 and 32.

The illustrated circuit 12 is used in controlling the deployment of one or more air bags in an occupant protection system. The circuit 12 includes several electronic components arranged and interconnected on a circuit board 14. The shielding component 20 has an interior volume 16 (FIG. 4) that is adapted to receive, and at least partially enclose, the circuit board 14 including the circuit 12.

A plurality of openings, or apertures, 40 are formed in the shielding component 20. In the illustrated embodiment, the apertures 40 are small circular openings in portions 42 of the sheet metal 22 that are upset from the walls of the shielding component. The apertures 40 can be formed in the shielding component 20 during the process of shaping the sheet metal 22 into the box-shaped configuration. A plurality of the apertures 40 are located in each one of the top wall 24, the back wall 28 and the side walls 30 and 32. The apertures 40 could have different shapes than the circular shape illustrated, and the apertures could be disposed at other locations on the shielding component 20, so long as they provide sufficient interlocking with the plastic material 50 as described below.

Two elongated slots 44 and 46 are formed in the front wall 26 of the shielding component 20. The slots 44 and 46 extend parallel to each other and are the same length as each other. The number and size of the slots depends on the number and spacing of the connector pins incorporated in the housing 10. A grounding pin opening 48 is also formed in the front wall 26 of the shielding component 20, at one end of the pair of slots 44 and 46. More than one grounding pin opening could be provided, to ensure better grounding.

The body of non-conductive plastic material 50 may be made from any suitable type of moldable plastic, including synthetic polymers, natural polymers, composites of synthetic polymers, composites of natural polymers, and/or any combinations thereof. The nonconductive plastic material 50 helps to waterproof the housing and to prevent electrical conduction through the housing 10 and electrical discharge from the housing.

The body of plastic material 50 is secured to the shielding component 20 by a suitable process, such as injection molding (insert molding). During the molding process, portions 52 (FIG. 1) of the plastic material 50 flow over and bond to the walls 24, 26, 28, 30 and 32 of the shielding component 50. These material portions 52 overlie the walls 24–32.

During the molding process, other portions 54 (FIG. 3) of the plastic material 50 flow into the apertures 40 in the shielding component 20. The material portions 54 are generally flush with the interior surfaces of the shielding component 20. When the body of plastic material 50 hardens, the material portions 54 in the apertures 40 act like rivets to mechanically interlock the plastic material to the shielding component 20. Because the apertures 40 are located on four sides of the six-sided shielding component 20, the plastic material portions 54 block movement of the shielding component away from the plastic material 50, and vice versa. The body of plastic material 50 is thus firmly secured to the shielding component 20.

Because of the mechanical interlocking engagement of the plastic material 50 and the metal shielding component 20, the integrity of the housing 10 is not based solely on the ability of the plastic material to bond to the metal shielding component. When relying on bonding alone, extra care must be taken to ensure that the outer surfaces of the metal component are virtually free of debris. This requirement can increase production costs and complicate the production process.

The housing 10 includes a plurality of connector pins for connecting the circuit board 14 to an external device (not shown), such as an air bag module. The number of connector pins is dependent on the configuration of the circuit 12 on the circuit board 14. In the illustrated example, two rows of eight or more connector pins 64 and 66, respectively, are provided.

All of the connector pins 64 and 66 in each row are illustrated as being identical to the other pins in that row, and similar in configuration (if not size) to the pins in the other row, also. It should be understood that the connector pins need not be identical to each other, and could have different configurations than illustrated, so long as they provide sufficient electrical interconnection with the circuit 12 as described below.

Each connector pin 64 or 66 (FIG. 4) is a generally L-shaped member made from an electrically conductive material, such as metal. The L-shaped configuration of each pin 64 or 66 includes a first leg 70 having a first end portion 72 of the connector pin, and a second leg 74 having a second end portion 76 of the connector pin. The first leg 70 of the connector pin 64 or 66 preferably has a bend 78 shown in FIG. 4.

The connector pins 64 and 66 are mounted in an insulator block, or insulator, 80. The insulator 80 is made from an electrically insulating material. The insulator 80 has a base portion 82 and two projecting portions 84 and 86. The insulator 80 has two rows of openings for receiving the first legs 70 of the connector pins 64 and 66. The two rows of openings are spaced apart by the same distance as the centers of the slots 44 and 46 in the front wall 26 of the shielding component 20.

The connector pins 64 and 66 may be associated within the insulator 80 in any suitable manner, such as by insert molding a plurality of separate connector pins. In a preferred embodiment, the insulator 80 is insert molded with the connector pins 64 and 66 to form a subassembly 94, which may thereafter be associated with the other parts of the housing 10. The bends 78 on the first legs 70 of the connector pins 64 and 66 help to prevent the pins from being pulled out of the insulator 80. The first and second end portions 72 and 76 of the connector pins 64 and 66 extend outward from the insulator 80.

The sub-assembly 94 of the insulator 80 and the connector pins 64 and 66 is mounted on the front wall 26 of the shielding component 20. The projecting portions 84 and 86 of the insulator 80 extend through the slots 44 and 46, respectively, in the front wall 26 of the shielding component 20. As a result, the first end portions 72 of the connector pins 64 in the first row extend outward from the shielding component 20, through the first slot 44 in the front wall 26 of the shielding component 20. The second end portions 76 of the connector pins 64 in the first row extend inward into the interior of the shielding component 20. The first end portions 72 of the connector pins 66 in the second row extend outward from the shielding component 20, through the second slot 46 in the front wall 26 of the shielding component 20. The second end portions 76 of the connector pins 66 in the second row extend inward into the interior of the shielding component 20.

The insulator 80 includes portions 100, which abut the inner side surface 102 of the front wall 26, to prevent the insulator 80 from being pulled off the front wall of the shielding component 20. It is preferred that the insulator 80 fit snugly within the opening slots 44 and 46, to seal the housing 10 and prevent unwanted debris and/or elements, such as water, from entering the housing.

The body of plastic material 50, when molded on the shielding component 20, helps to secure the subassembly 94 of the insulator 80 and the connector pins 64, 66 to the shielding component 20. The subassembly 94 is mounted in the front wall 26 of the shielding component 20 prior to the step of molding the body of plastic material 50 to the shielding component. When the body of plastic material 50 is, thereafter, molded to the shielding component 20, a portion 110 (FIG. 4) of the body of plastic material overlies the projecting portions 84 and 86 of the insulator 80. The engagement of the plastic material 50 with the insulator 80 helps to retain the insulator, and the connector pins 64 and 66, in the desired association with the shielding component 20.

Another portion 112 of the body of plastic material 50 overlies the first legs 70 of each of the connector pins 64 and 66 in the first and second rows. The first end portions 70 of the connector pins 64 and 66 extend outward from the plastic material portion 112. The first end portions 72 of the connector pins 64 and 66 can, therefore, be connected to a device external to the housing 10, such as an air bag module, for example. The second end portions 76 of the connector pins 64 and 66 extend into an interior space of the shielding component 20. The second end portions 76 of the pins 64 and 66 can be operatively connected to the circuit 12 on the circuit board 14.

The insulator 80 prevents the connector pins 64 and 66 from coming into contact with the shielding component 20. The insulator 80 thereby prevents electrical conduction between the electrically conductive shielding component 20 and the electrically conductive connector pins 64 and 66.

In the illustrated embodiment, all of the connector pins 64 and 66 are associated with one insulator 80. Alternatively, individual connector pins may be associated with one or more individual insulator members. In that case, the shielding component 20 would have a larger number of openings, to accommodate the number of separate insulators used. Minimizing the size and number of the apertures in the shielding component 20, however, helps to increase the interference shielding capability of the shielding component. Therefore, it is preferred that the openings in the shielding component 20 be kept to a minimum.

The housing 100 also includes a grounding pin 120 (FIGS. 4 and 6). The grounding pin 120 is a generally L-shaped member made from an electrically conductive material, such as metal. The L-shaped configuration of the grounding pin 120 includes an enlarged first end portion 122 and a second end portion 124. The grounding pin 120 may be molded in the insulator 80 along with the connector pins 64 and 66.

The first end portion 122 of the grounding pin 120 is operatively connected to the shielding component 20. It is preferred that the first end portion 122 of the grounding pin 120 not extend outward from the shielding component 20. In the embodiment shown in FIG. 6, the enlarged first end portion 122 of the grounding pin 120 is press fit in the grounding pin opening 48 in the front wall 26 of the shielding component 20.

The engagement of the first end portion 122 of the grounding pin 120 with the front wall 26 of the shielding component 20 establishes an electrical connection between the grounding pin and the shielding component. Alternatively, the first end portion 122 of the grounding pin 120 may be soldered to the shielding component 20. The second end portion 124 of the grounding pin 120 is operatively connectable to the circuit 12 when the circuit board 14 is installed in the housing 10, as described below.

An alternative grounding pin 120a is shown in FIG. 7. The grounding pin 120a has a first end portion 122a that is not enlarged and that is received in a punched opening 48a in a shielding component 20a.

The mounting ears 34 of the shielding component 20 can be directly connected to ground by, for example, mounting screws (not shown) extending through openings 126 in the mounting ears. Such an electrical connection of the shielding component 120 to ground effectively provides a ground for the circuit 12 in the housing 10, without the need for a large opening in the shielding component 20 to pass through a ground wire.

One portion 130 of the body of plastic material 50, when molded on the shielding component 20, forms a shroud. The shroud 130 partially encloses, and protects, the projecting first end portions 72 of the connector pins 64 and 66. The shroud 130 receives an electrical connector (not shown) by which the connector pins 64 and 66 are electrically connected with the external device.

The body of plastic material 50, when molded on the shielding component 20, preferably forms a plurality of mounting bosses 132 within the shielding component 20. The mounting bosses 132 are adapted to receive mounting members (not shown), such as screws, for fastening the circuit board 14 inside the shielding component 20. When the circuit board 14 is thus fastened to the housing 20, pads on the circuit board engage the second end portions 76 of the connector pins 64 and 66, and also the second end portion 124 of the grounding pin 120, to establish the needed electrical connections with the circuit board.

From the above description of the invention, those skilled in the art will perceive improvements, changes and modifications in the invention. Such improvements, changes and modifications are intended to be included within the scope of the appended claims.

Having described the invention, we claim:

1. A housing for shielding a circuit from electromagnetic interference, comprising:

a shielding component including an interior that is adapted to receive and at least partially enclose the circuit, the shielding component having at least one aperture that provides access to said interior; and a plastic material molded over said shielding component, a portion of said plastic material being received within said at least one aperture of said shielding component during molding of said plastic material over said shielding component so that said plastic material forms an interlocking portion for securing said plastic material to said shielding component, said interlocking portion having an interior surface that is located within said shielding component and that has an area that is greater than an area of said at least one aperture.

2. A housing as set forth in claim 1 further comprising:

at least one electrically conductive connector pin having a first end portion and a second end portion; and, an insulator, a portion of said at least one electrically conductive connector pin being disposed within said insulator, said first end portion and said second end portion of said at least one electrically conductive connector pin extending outward from said insulator;

said shielding component including an opening for receiving said insulator such that said first end portion of said at least one electrically conductive connector pin extends outward from said shielding component, said second end portion of said at least one electrically conductive connector pin extends into an interior of said shielding component, and said at least one electrically conductive connector pin is electrically isolated from said shielding component.

3. A housing as set forth in claim 2 wherein said first end portion of said at least one electrically conductive connector pin also extends outward from said plastic material.

4. A housing as set forth in claim 1 wherein said shielding component has a plurality of apertures formed in a plurality of walls of said shielding component, said plurality of apertures including said at least one aperture, said plastic material having portions overlying said plurality of walls of said shielding component and having interlocking portions received within each one of said plurality of apertures during molding of said plastic material to secure said plastic material to said walls of said shielding component, each interlocking portion having an interior surface located within said shielding component and having an area greater than an area of its associated aperture.

5. A housing as set forth in claim 4 wherein said plastic material is molded over at least a portion of said at least one electrically conductive connector pin and is molded over at least a portion of an insulator for supporting said at least one electrically conductive connector pin and for insulating said at least one electrically conductive connector pin from said shielding component.

6. A housing as set forth in claim 1 further comprising a grounding pin having a first end portion and a second end portion, said first end portion of said grounding pin being operatively connected to said shielding component, said second end portion of said grounding pin being operatively connectable to the circuit, said first end portion of said grounding pin not extending outward from said plastic material.

7. A housing as set forth in claim 6 wherein said first end portion of said grounding pin is received in an opening in said shielding component to electrically connect said ground pin with said shielding component.

8. A housing as set forth in claim 1 wherein:

said shielding component has a plurality of apertures including said at least one aperture, said plastic material having interlocking portions received within each one of said plurality of apertures to secure said plastic material to said shielding component, each interlocking portion having an interior surface located within said shielding component and having an area greater than an area of its associated aperture;

said housing comprises at least one electrically conductive connector pin having a first end portion and a second end portion; and, said housing comprises an insulator, a portion of said at least one electrically conductive connector pin being said first end portion and disposed within said insulator, said second end portion of said at least one electrically conductive connector pin extending outward from said insulator; and said shielding component includes an opening for receiving said insulator such that said first end portion of said at least one electrically conductive connector pin extends outward from said shielding component, said second end portion of said at least one electrically conductive connector pin extends into said interior of said shielding component, and said at least one electrically conductive connector pin is electrically isolated from said shielding component.

9. A housing for shielding a circuit from electromagnetic interference, comprising:

a shielding component including a top wall, front and back walls, and two side walls that collectively define an interior that is adapted to receive and at least partially enclose the circuit, a plurality of apertures extending through each of said top wall, said back wall, and said two side walls for providing access to said interior; and a plastic material molded over said shielding component, a portion of said plastic material being received within each aperture of said plurality of apertures during molding of said plastic material over said shielding component so that said plastic material forms a plurality of interlocking portions in said interior of said shielding component, each aperture of said plurality of apertures including an associated interlocking portion of the plurality of interlocking portions so that said plastic material is secured to said top wall, said back wall, and said two side walls of said shielding component.

10. A housing as set forth in claim 9 wherein:

said front wall of said shielding component includes a slot that provides access to said interior of said shielding component, at least one electrically conductive connector pin adapted to extend through said slot for connecting to the circuit.

11. A housing as set forth in claim 10 wherein:

an insulator is adapted to support a portion of said at least one electrically conductive connector pin;

said shielding component including an opening for receiving said insulator, said insulator electrically isolating said at least one electrically conductive connector pin from said shielding component.

12. A housing for shielding a circuit from electromagnetic interference, comprising:

a shielding component including an interior that is adapted to receive and at least partially enclose the circuit, the shielding component having at least one aperture that provides access to said interior; and a plastic material molded over said shielding component, a portion of said plastic material being received within said at least one aperture of said shielding component during molding of said plastic material over said shielding component so that said plastic material forms an interlocking portion having a dimension that is greater than a dimension of said at least one aperture for securing said plastic material to said shielding component, said shielding component including an upset portion that extends outwardly from said shielding component, said interlocking portion of said plastic material being formed under said upset portion so that an end surface of said interlocking portion is flush with an interior surface of said shielding component.

13. A housing for shielding a circuit from electromagnetic interference, comprising:

a shielding component including a top wall, front and back walls, and two side walls that collectively define an interior that is adapted to receive and at least partially enclose the circuit, a plurality of apertures extending through each of said top wall, said back wall, and said two side walls for providing access to said interior; and a plastic material molded over said shielding component, a portion of said plastic material being received within each aperture of said plurality of apertures during molding of said plastic material over said shielding component so that said plastic material forms a plurality of interlocking portions in said interior of said shielding component, each aperture of said plurality of apertures including an associated interlocking portion of the plurality of interlocking portions so that said plastic material is secured to said top wall, said back wall, and said two side walls of said shielding component, said top wall, back wall, and two side walls of said shielding component include a plurality of upset portions, extending from an associated wall of said top wall, back wall, and two side walls, each interlocking portion of said plurality of interlocking portions being formed under said upset portion so that an end surface of said interlocking portion is flush with an interior surface of said associated wall.

* * * * *